US006649978B2

United States Patent
Mukherjee et al.

(10) Patent No.: US 6,649,978 B2
(45) Date of Patent: Nov. 18, 2003

(54) SEMICONDUCTOR MODULE HAVING MULTIPLE SEMICONDUCTOR CHIPS

(75) Inventors: Satyen Mukherjee, Yorktown Heights, NY (US); Ton Mobers, Wederik (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/884,223

(22) Filed: Jun. 19, 2001

(65) Prior Publication Data

US 2002/0190317 A1 Dec. 19, 2002

(51) Int. Cl.$^7$ ............................................. H01L 27/01
(52) U.S. Cl. ..................... 257/347; 257/341; 257/350; 257/351; 257/706; 257/709; 257/723; 257/728
(58) Field of Search ................................. 257/347, 351, 257/350, 341, 706, 707, 709, 723, 728

(56) References Cited

U.S. PATENT DOCUMENTS

| | | | | |
|---|---|---|---|---|
| 4,947,234 A | | 8/1990 | Einzinger et al. ............ 357/68 |
| 5,305,186 A | * | 4/1994 | Appelt et al. ............... 361/704 |
| 5,814,885 A | * | 9/1998 | Pogge et al. ................ 257/730 |
| 6,028,348 A | * | 2/2000 | Hill ............................ 257/666 |
| 6,130,458 A | * | 10/2000 | Takagi et al. ............... 257/351 |
| 6,140,690 A | * | 10/2000 | Oka et al. ................... 257/494 |
| 6,153,912 A | * | 11/2000 | Holst .......................... 257/347 |
| 6,191,451 B1 | * | 2/2001 | Nowak et al. ............... 257/347 |
| 6,214,653 B1 | * | 4/2001 | Chen et al. .................. 438/153 |
| 6,252,179 B1 | * | 6/2001 | Lauffer et al. ............... 174/263 |
| 6,269,011 B1 | * | 7/2001 | Ohshima ...................... 365/50 |
| 6,333,532 B1 | * | 12/2001 | Davari et al. ............... 257/301 |

FOREIGN PATENT DOCUMENTS

| | | | |
|---|---|---|---|
| EP | 471 938 | * | 6/1991 |
| EP | 471 938 A1 | * | 6/1991 |
| EP | 471 938 | * | 2/1992 |
| JP | 0169057 A1 | | 6/1994 |
| JP | 6-169057 | * | 6/1994 |
| JP | 6-310633 | * | 11/1994 |
| JP | 63-292681 | * | 11/1998 |

* cited by examiner

*Primary Examiner*—Nathan J. Flynn
*Assistant Examiner*—Ahmed N. Sefer
(74) *Attorney, Agent, or Firm*—Steven R. Biren

(57) ABSTRACT

A multiple semiconductor chip (multi-chip) module includes at least an output semiconductor chip and a control semiconductor chip mounted on an electrically conductive heat sink. The output semiconductor chip may have a bulk substrate configuration and the control semiconductor chip may have a Silicon-On-Insulator (SOI) configuration. The output semiconductor chip and the control semiconductor chip are directly mounted on the electrically conductive heat sink without the use of a separate electrical insulation layer in order to obtain a multi-chip module which is simple and economical to manufacture, and which offers superior performance characteristics such as enhanced heat sink efficiency and reduced EMI.

11 Claims, 1 Drawing Sheet

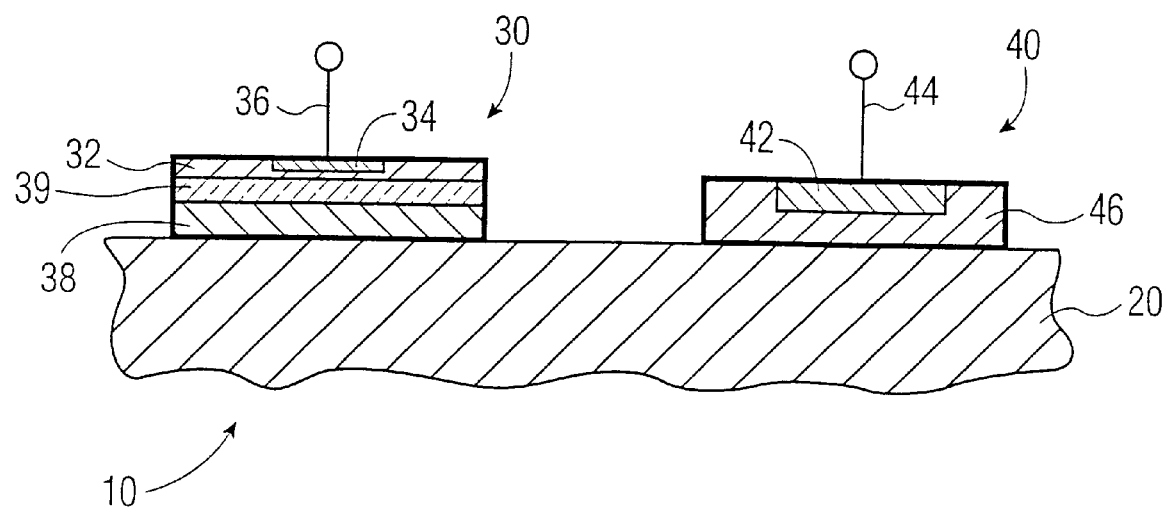

SEMICONDUCTOR MODULE HAVING MULTIPLE SEMICONDUCTOR CHIPS

BACKGROUND OF THE INVENTION

The invention is in the field of semiconductor devices, and relates more specifically to multiple semiconductor chip (hereinafter multi-chip) modules for use over a wide range of voltage and power levels.

Multi-chip module technology has recently been applied to integrated circuits used in both power and control applications, such as power supplies, power converters and electronic ballast circuits. Such multi-chip modules typically include at least an output semiconductor chip and a control semiconductor chip, mounted on an electrically conductive (typically metal) heat sink. In the prior art, one or more of the chips employed in the module must be electrically insulated from the metal heat sink in order to maintain electrical isolation, thus requiring a relatively complicated structure which is costly to manufacture.

A typical prior-art device configuration of this type is shown in Japanese patent abstract JP 6-169057A. In the elementary multi-chip module shown in this reference, one chip is shown as soldered directly to a heat sink, while a second chip is provided on an electrode plate, which is in turn provided on an insulating ceramic plate provided on the heat sink.

While the foregoing structure permits the fabrication of a multi-chip module incorporating different chip types and functions, it is relatively complicated and therefore uneconomical to manufacture, and in certain applications structures of this type will generate electromagnetic (EMI) radiation.

Another prior-art multi-chip configuration is shown in U.S. Pat. No. 6,130,458, which in FIG. 12B shows a multi-chip structure in which both the control chips and the power chip are fabricated in the same SOI (Silicon-On-Insulator) technology. In U.S. patent application No. 09/440,595, commonly-assigned with the instant application and having the present inventors in common, a multi-chip module is provided with an SOI high power chip and a bulk-substrate control chip. However, a drawback of these configurations is that heat-sink efficiency for the power chip is reduced due to the presence of an insulating layer between the active device and the conductive mounting plate.

Accordingly, it would be desirable to have a multi-chip module which is simple in construction and therefore economical to fabricate, and in which performance parameters such as heat sink efficiency and reduced EMI are enhanced.

SUMMARY OF THE INVENTION

It is therefore an object of the present invention to provide a multi-chip module for use over a wide range of applications which is simple in construction, economical to fabricate, and capable of offering enhanced performance, and in particular improved heat sink efficiency and reduced EMI.

In accordance with the invention, these objects are achieved in a multi-chip module of the type described above in which a plurality of semiconductor chips of different types are all directly mounted on an electrically conductive heat sink without the use of a separate electrical insulation layer.

In a preferred embodiment of the invention, the multi-chip module includes at least an output semiconductor chip having a bulk substrate configuration and an SOI control semiconductor chip, with both the output semiconductor chip and the control semiconductor chip being directly mounted on the electrically conductive heat sink without the use of a separate electrical insulation layer.

In further preferred embodiments of the invention, the control semiconductor chip may include BIMOS, bipolar, or CMOS devices, and the output chip may include MOS, bipolar or IGBT devices.

Multi-chip modules in accordance with the present invention offer a significant improvement in that a simple, economical configuration having improved performance characteristics such as enhanced heat sink efficiency and reduced EMI (Electro-Magnetic Interference) is achieved.

These and other aspects of the invention will he apparent from and elucidated with reference to the embodiments described hereinafter.

BRIEF DESCRIPTION OF THE DRAWING

The invention may be more completely understood with reference to the following description, to be read in conjunction with the accompanying drawing, in which the single FIGURE shows a simplified cross-sectional view of a multi-chip module in accordance with a preferred embodiment of the invention.

It should be understood that the single FIGURE of the drawing is not drawn to scale.

DESCRIPTION OF THE PREFERRED EMBODIMENTS

In the simplified cross-sectional view of the single FIGURE, a multiple semiconductor chip (multi-chip) module 10 suitable for use over a wide range of voltage and power levels is shown. The multi-chip module 10 includes an electrically conductive heat sink 20, typically a metal heat sink of copper or aluminum, on which are directly mounted a plurality of semiconductor chips, such as chips 30 and 40 shown in simplified form within bold rectangles in the FIGURE. It should be noted that the semiconductor chips 30 and 40 are directly mounted on the conductive heat sink 20 without the use of a separate electrical insulation layer as is typically required in the prior art.

In the example shown, semiconductor chip 30 is a control semiconductor chip, here shown as a Silicon-On-Insulator (SOI) device having a semiconductor substrate 38, a buried insulating layer 39, and an SOI layer 32 having at least one semiconductor device symbolically shown by region 34 provided therein. Electrical connections to the semiconductor device(s) 34 are symbolically shown by the single electrode 36, although it will be recognized that in an actual device more than one connection and multiple devices will typically be provided. By fabricating the control semiconductor chip in SOI technology, it becomes possible to directly mount this semiconductor chip on the conductive heat sink 20 without the use of a separate electrical insulation layer, since the active portions of the chip are insulated from the substrate 38 by oxide insulation layer 39 within the chip itself. Control semiconductor chip 30 can be directly mounted on the conductive heat sink 20 by known conventional methods, such as soldering or gluing with a conductive glue. In this configuration, the active portions of the chip can advantageously be provided with voltages independent of the voltage on the substrate 38 and conductive heat sink 20 due to the presence of insulation layer 39 within the control chip itself.

The multi-chip module also includes an output semiconductor chip 40 shown in simplified form in the FIGURE, also directly mounted on the conductive heat sink 20 in a known manner as discussed above without the use of a separate electrical insulation layer. The output semiconductor chip 40 is symbolically shown by a bulk substrate 46 in which is formed at least one semiconductor device 42, with electrical connections to the at least one device being symbolically shown by the single connection electrode 44. Since the output semiconductor chip 40 has a bulk substrate 46 which is directly connected to the conductive heat sink 20, the heat sink must be maintained at an appropriate voltage level to ensure proper operation of the chip 40. This voltage may be ground or any other suitable voltage. Alternatively, semiconductor junction isolation can be used to electrically isolate the device(s) 42 from the heat sink, in a manner known to those skilled in the art and symbolically shown in the FIG. by device 42 and substrate 46 being hatched in opposite directions to indicate a p-n junction.

In order to further reduce the manufacturing cost of multi-chip module 10, the control semiconductor chip 30 can employ a low-cost technology using BIMOS, bipolar, or CMOS devices to implement the control circuit devices symbolically shown by reference numeral 34. The output semiconductor chip 40 may typically employ MOS, bipolar or IGBT devices, and an additional semiconductor layer may be provided in the substrate to secure junction isolation of the devices from the heat sink as mentioned above. It will be recognized that various technologies may be used to fabricate both the control and output circuitry, the only limitation being that the back of the output chip 40 (substrate 46) must be capable of being directly and conductively mounted on the conductive heat sink 20. To this end, the heat sink voltage may be set to a value compatible with the operating requirements of the output chip 40. A further advantage of having the control semiconductor chip 30 and the output semiconductor chip 40 on the same heat sink within a single module is that EMI will be reduced, since external inter-chip wiring that could radiate EMI is eliminated. Additionally, heat sink efficiency is improved since the output chip, which will typically dissipate more power than the control chip, is not isolated from the heat sink by an insulating layer. As in the case of control semiconductor chip 30, output semiconductor chip 40 may be mounted to the conductive heat sink 20 by soldering or any other conventional electrically conductive fastening technique such as gluing.

It will be understood that while the simplified representative structure shown in the single FIGURE depicts a preferred embodiment of the invention, numerous variations in device geometry, configuration and number of chips used are contemplated within the scope of the invention. Nevertheless, it is noted that several advantages accrue by using any of these configurations in accordance with the invention. By directly mounting all of the semiconductor chips on the same conductive heat sink without the use of a separate electrical insulation layer, the fabrication process is simplified and made more economical, EMI is reduced and efficient heat transfer is ensured. Additionally, by using a low-cost technology such as BIMOS, CMOS or bipolar for the control semiconductor chip(s), further advantages in economy and performance are obtained. Finally, by using an SOI device for the control semiconductor chip, direct mounting of this chip is facilitated while permitting great flexibility in device design, independent of the voltage on the substrate and heat sink, since the active portions of the device are internally insulated from the substrate and heat sink. This technique also permits the heat sink to be placed at an optimum voltage for proper operation of the output chip.

In the foregoing manner, the present invention provides a multi-chip module which is simple in structure, economical to fabricate and which offers performance advantages.

While the invention has been particularly shown and described with reference to several preferred embodiments thereof, it will be understood by those skilled in the art that various changes in form and detail may be made without departing from the spirit or scope of the invention. In this application it should be understood that the word "a" or "an" preceding an element does not exclude the presence of a plurality of such elements, and that the word "comprising" does not exclude the presence of other elements or steps than those described or claimed.

What is claimed is:

1. A multiple semiconductor chip (multi-chip) module comprising at least an output semiconductor chi and a control semiconductor chip mounted on an electrically conductive heat sink, wherein said output semiconductor chip comprises a bulk substrate configuration and said control semiconductor chip comprises a Silicon-On-Insulator (501) configuration, and said output semiconductor chip and said control semiconductor chip are both directly mounted on said electrically conductive heat sink without the use of an intervening electrical insulation layer and wherein said conductive heat sink is maintained at a selected voltage for ensuring proper operation of said output semiconductor chip.

2. A multi-chip module as in claim 1, wherein said control semiconductor chip semiconductor device comprises a BIMOS device.

3. A multi-chip module as in claim 1, wherein said control semiconductor chip semiconductor device comprises a CMOS device.

4. A multi-chip module as in claim 1, wherein said control semiconductor chip semiconductor device comprise a bipolar device.

5. A multi-chip module as in claim 1, wherein said conductive heat sink is maintained at ground potential.

6. A multi-chip module as in claim 1, wherein said conductive heat sink comprises a metal.

7. A multi-chip module as in claim 6, wherein said metal comprises copper.

8. A multi-chip module as in claim 1, wherein said output semiconductor chip comprises an MOS device.

9. A multi-chip module as in claim 1, wherein said output semiconductor chip comprises a bipolar device.

10. A multi-chip module as in claim 1, wherein said output semiconductor chip comprises in IGBT device.

11. A multi-chip module as in claim 1, wherein said output semiconductor chip comprises a p-n junction for providing junction isolation for a device within said output semiconductor chip.

* * * * *